United States Patent
Shirai et al.

(10) Patent No.: US 9,613,671 B2
(45) Date of Patent: Apr. 4, 2017

(54) NONVOLATILE RANDOM ACCESS MEMORY INCLUDING CONTROL CIRCUIT CONFIGURED TO RECEIVE COMMANDS AT HIGH AND LOW EDGES OF ONE CLOCK CYCLE

(71) Applicants: Yutaka Shirai, Seongnam (KR); Naoki Shimizu, Seoul (KR); Kenji Tsuchida, Seoul (KR); Yoji Watanabe, Yokohama (JP); Ji Hyae Bae, Icheon-si (KR); Yong Ho Kim, Namyangju-si (KR)

(72) Inventors: Yutaka Shirai, Seongnam (KR); Naoki Shimizu, Seoul (KR); Kenji Tsuchida, Seoul (KR); Yoji Watanabe, Yokohama (JP); Ji Hyae Bae, Icheon-si (KR); Yong Ho Kim, Namyangju-si (KR)

(73) Assignees: KABUSHIKI KAISHA TOSHIBA, Tokyo (JP); SK HYNIX INC., Icheon-si, Gyeonggi-Do (KR)

( * ) Notice: Subject to any disclaimer, the term of this patent is extended or adjusted under 35 U.S.C. 154(b) by 0 days.

(21) Appl. No.: 14/692,239

(22) Filed: Apr. 21, 2015

(65) Prior Publication Data

US 2015/0228320 A1 Aug. 13, 2015

Related U.S. Application Data

(62) Division of application No. 14/020,534, filed on Sep. 6, 2013, now Pat. No. 9,042,198.

(Continued)

(51) Int. Cl.
*G11C 8/00* (2006.01)
*G11C 8/18* (2006.01)
(Continued)

(52) U.S. Cl.
CPC .............. *G11C 8/18* (2013.01); *G11C 7/12* (2013.01); *G11C 8/10* (2013.01); *G11C 8/12* (2013.01);
(Continued)

(58) Field of Classification Search
CPC ....................................... G11C 8/18
(Continued)

(56) References Cited

U.S. PATENT DOCUMENTS 6,510,095 B1 1/2003 Matsuzaki et al.
2002/0116657 A1 8/2002 Uchida
(Continued)

FOREIGN PATENT DOCUMENTS

| JP | 2005063553 A | 3/2005 |
| JP | 2012022726 A | 2/2012 |
| TW | 201214437 A | 4/2012 |

OTHER PUBLICATIONS

Taiwanese Office Action (and English translation thereof) dated Oct. 5, 2015, issued in counterpart Taiwanese Application No. 103108310.

(Continued)

*Primary Examiner* — Hoai V Ho
(74) *Attorney, Agent, or Firm* — Holtz, Holtz & Volek PC

(57) ABSTRACT

According to one embodiment, a memory includes a memory cell array with banks, each bank including rows, a first word lines provided in corresponding to the rows, an address latch circuit which latches a first row address signal, a row decoder which activates one of the first word lines, and a control circuit which is configured to execute a first operation which activates one of the banks based on a bank address signal when a first command is loaded, and a second operation which latches the first row address signal in the address latch circuit, and execute a third operation which (Continued)

activates one of the first word lines by the row decoder based on a second row address signal and the first row address signal latched in the address latch circuit when a second command is loaded after the first command.

15 Claims, 17 Drawing Sheets

Related U.S. Application Data

(60) Provisional application No. 61/803,997, filed on Mar. 21, 2013.

(51) Int. Cl.
   *G11C 7/12* (2006.01)
   *G11C 8/10* (2006.01)
   *G11C 8/12* (2006.01)
   *G11C 11/16* (2006.01)
   *G11C 7/10* (2006.01)

(52) U.S. Cl.
   CPC ........ *G11C 11/1653* (2013.01); *G11C 7/1039* (2013.01)

(58) Field of Classification Search
   USPC .......................................... 365/230.03, 233.1
   See application file for complete search history.

(56) References Cited

U.S. PATENT DOCUMENTS

| | | |
|---|---|---|
| 2003/0088753 A1 | 5/2003 | Ikeda et al. |
| 2007/0147160 A1 | 6/2007 | Hanzawa et al. |
| 2008/0151678 A1 | 6/2008 | Ikeda et al. |
| 2010/0318718 A1 | 12/2010 | Eilert et al. |
| 2011/0085403 A1 | 4/2011 | Nishioka |
| 2012/0044742 A1 | 2/2012 | Narayanan |
| 2012/0185663 A1* | 7/2012 | Yokoya ................. G06F 1/3275 711/167 |
| 2013/0223165 A1* | 8/2013 | Maheshwari ......... G11C 11/408 365/189.15 |
| 2013/0275830 A1* | 10/2013 | Park ...................... H03M 13/09 714/758 |
| 2014/0016404 A1* | 1/2014 | Kim ..................... G11C 11/165 365/158 |

OTHER PUBLICATIONS

International Search Report and Written Opinion Dated Jun. 10, 2014 Issued for International Application No. PCT/JP2014/057024.
International Preliminary Report on Patentability (IPRP) including Written Opinion (in English) dated Sep. 22, 2015, issued in parent International Application No. PCT/JP2014/057024.
Japanese Office Action (and English translation thereof) dated Sep. 13, 2016, issued in counterpart Japanese Application No. 2016-503911.

* cited by examiner

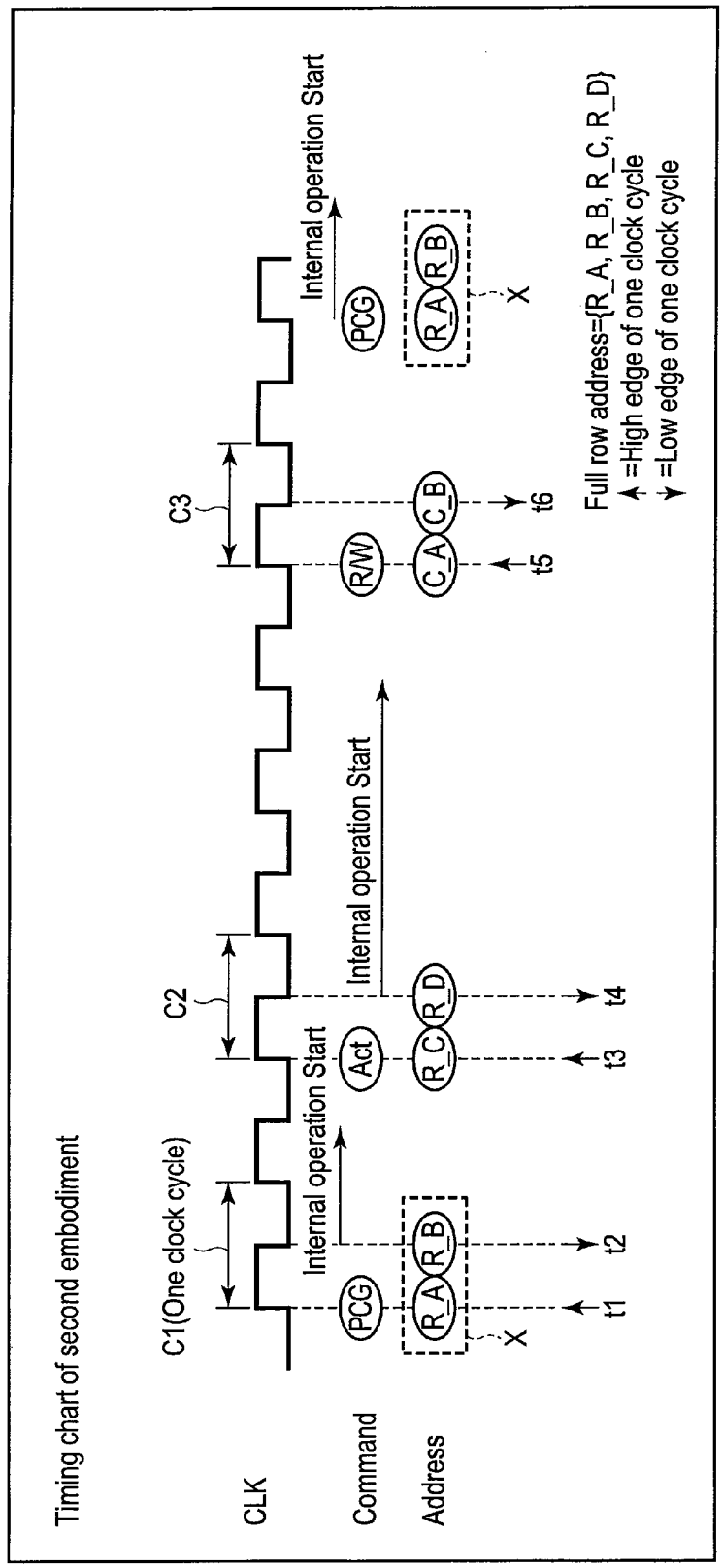
F I G. 6

| Case 1a | CLK | CA0 | CA1 | CA2 | CA3 | CA4 | CA5 | CA6 | CA7 | CA8 | CA9 |
|---|---|---|---|---|---|---|---|---|---|---|---|
| Precharge | ↑ | H | H | L | H | AB | X | X | BA0 | BA1 | BA2 |
| | ↓ | X | X | X | R14 | R15 | R16 | R17 | BA0 | BA1 | BA2 |

CA8, CA9 (BA1, BA2 on ↑ row): For precharge
BA0, BA1, BA2 (↓ row): For pre-active

FIG. 7

| Case 1b | CLK | CA0 | CA1 | CA2 | CA3 | CA4 | CA5 | CA6 | CA7 | CA8 | CA9 |
|---|---|---|---|---|---|---|---|---|---|---|---|
| Precharge | ↑ | H | H | L | H | AB | R14 | R15 | BA0 | BA1 | BA2 |
| | ↓ | X | X | X | X | X | R16 | R17 | BA0 | BA1 | BA2 |

CA7, CA8, CA9 (↑ row): For precharge & for pre-active
BA0, BA1, BA2 (↓ row): For pre-active

FIG. 8

| Case 2a | CLK | CA0 | CA1 | CA2 | CA3 | CA4 | CA5 | CA6 | CA7 | CA8 | CA9 |
|---|---|---|---|---|---|---|---|---|---|---|---|
| Precharge | ↑ | H | H | L | H | AB | X | X | BA0 | BA1 | BA2 |
| | ↓ | X | X | X | R14 | R15 | R16 | R17 | X | X | X |

For precharge & for pre-active

FIG. 9

| Case 2b | CLK | CA0 | CA1 | CA2 | CA3 | CA4 | CA5 | CA6 | CA7 | CA8 | CA9 |
|---|---|---|---|---|---|---|---|---|---|---|---|
| Precharge | ↑ | H | H | L | H | AB | R14 | R15 | BA0 | BA1 | BA2 |
| | ↓ | X | X | X | X | X | R16 | R17 | X | X | X |

For precharge & for pre-active

FIG. 10

Selectable case

| Case 3a-1 | CLK | CA0 | CA1 | CA2 | CA3 | CA4 | CA5 | CA6 | CA7 | CA8 | CA9 |
|---|---|---|---|---|---|---|---|---|---|---|---|
| Precharge & active | ↑ | H | H | L | H | AB | X | X | BA0 | BA1 | BA2 | ← For precharge |
|  | ↓ | L | H | X | R14 | R15 | R16 | R17 | BA0 | BA1 | BA2 | ← For pre-active | or

| Case 3a-2 | CLK | CA0 | CA1 | CA2 | CA3 | CA4 | CA5 | CA6 | CA7 | CA8 | CA9 |
|---|---|---|---|---|---|---|---|---|---|---|---|
| Precharge | ↑ | H | H | L | H | AB | X | X | BA0 | BA1 | BA2 | ← For precharge |
|  | ↓ | X | X | X | X | X | X | X | X | X | X | or

| Case 3a-3 | CLK | CA0 | CA1 | CA2 | CA3 | CA4 | CA5 | CA6 | CA7 | CA8 | CA9 |
|---|---|---|---|---|---|---|---|---|---|---|---|
| Active | ↑ | X | X | X | X | X | X | X | X | X | X |
|  | ↓ | L | H | X | R14 | R15 | R16 | R17 | BA0 | BA1 | BA2 | ← For pre-active |

FIG. 11

Selectable case

| Case 3b-1 | CLK | CA0 | CA1 | CA2 | CA3 | CA4 | CA5 | CA6 | CA7 | CA8 | CA9 |
|---|---|---|---|---|---|---|---|---|---|---|---|
| Precharge & active | ↑ | H | H | L | H | AB | R14 | R15 | BA0 | BA1 | BA2 | ← For precharge & for pre-active |
|  | ↓ | L | H | X | X | X | R16 | R17 | BA0 | BA1 | BA2 | ← For pre-active | or

| Case 3b-2 | CLK | CA0 | CA1 | CA2 | CA3 | CA4 | CA5 | CA6 | CA7 | CA8 | CA9 |
|---|---|---|---|---|---|---|---|---|---|---|---|
| Precharge | ↑ | H | H | L | H | AB | R16 | R17 | BA0 | BA1 | BA2 | ← For precharge & for pre-active |
|  | ↓ | X | X | X | X | X | X | X | X | X | X | or

| Case 3b-3 | CLK | CA0 | CA1 | CA2 | CA3 | CA4 | CA5 | CA6 | CA7 | CA8 | CA9 |
|---|---|---|---|---|---|---|---|---|---|---|---|
| Active | ↑ | X | X | X | X | X | X | X | X | X | X |
|  | ↓ | L | H | X | X | X | R16 | R17 | BA0 | BA1 | BA2 | ← For pre-active |

F I G. 12

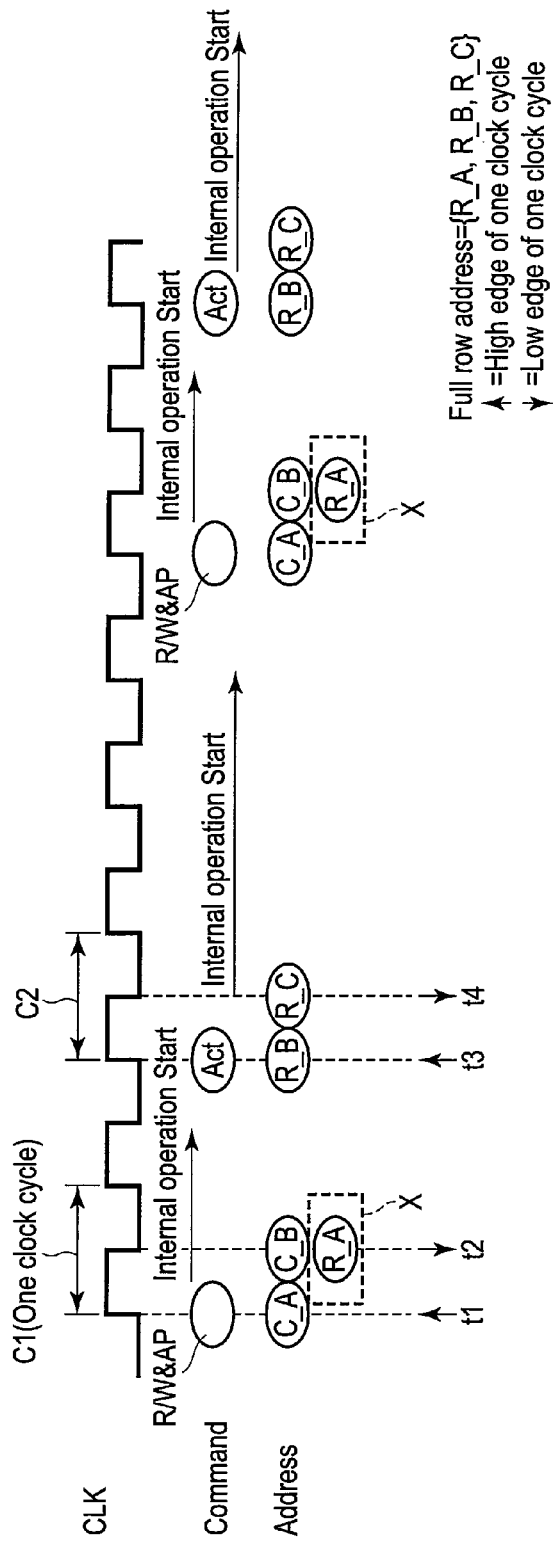
F I G. 14

| Case 4 | CLK | CA0 | CA1 | CA2 | CA3 | CA4 | CA5 | CA6 | CA7 | CA8 | CA9 |
|---|---|---|---|---|---|---|---|---|---|---|---|
| Read/write with auto precharge | ↑ | H | L | H/L | X | X | C1 | C2 | BA0 | BA1 | BA2 |
| | ↓ | H(AP) | C3 | C4 | C5 | C6 | C7 | R14 | R15 | R16 | R17 |

For read/write with auto-precharge & for pre-active

F I G. 15

| Case 5a | CLK | CA0 | CA1 | CA2 | CA3 | CA4 | CA5 | CA6 | CA7 | CA8 | CA9 |
|---|---|---|---|---|---|---|---|---|---|---|---|
| Read/write with auto precharge | ↑ | H | L | H/L | X | X | C1 | C2 | BA0 | BA1 | BA2 |
| | ↓ | H(AP) | C3 | C4 | R14 | R15 | R16 | R17 | BA0 | BA1 | BA2 |

For read/write → CA9
For auto-precharge & for pre-active → BA2

FIG. 16

| Case 5b | CLK | CA0 | CA1 | CA2 | CA3 | CA4 | CA5 | CA6 | CA7 | CA8 | CA9 |
|---|---|---|---|---|---|---|---|---|---|---|---|
| Read/write with auto precharge | ↑ | H | L | H/L | C1 | C2 | C3 | C4 | BA0 | BA1 | BA2 |
| | ↓ | H(AP) | X | X | R14 | R15 | R16 | R17 | BA0 | BA1 | BA2 |

For read/write → CA9
For auto-precharge & for pre-active → BA2

FIG. 17

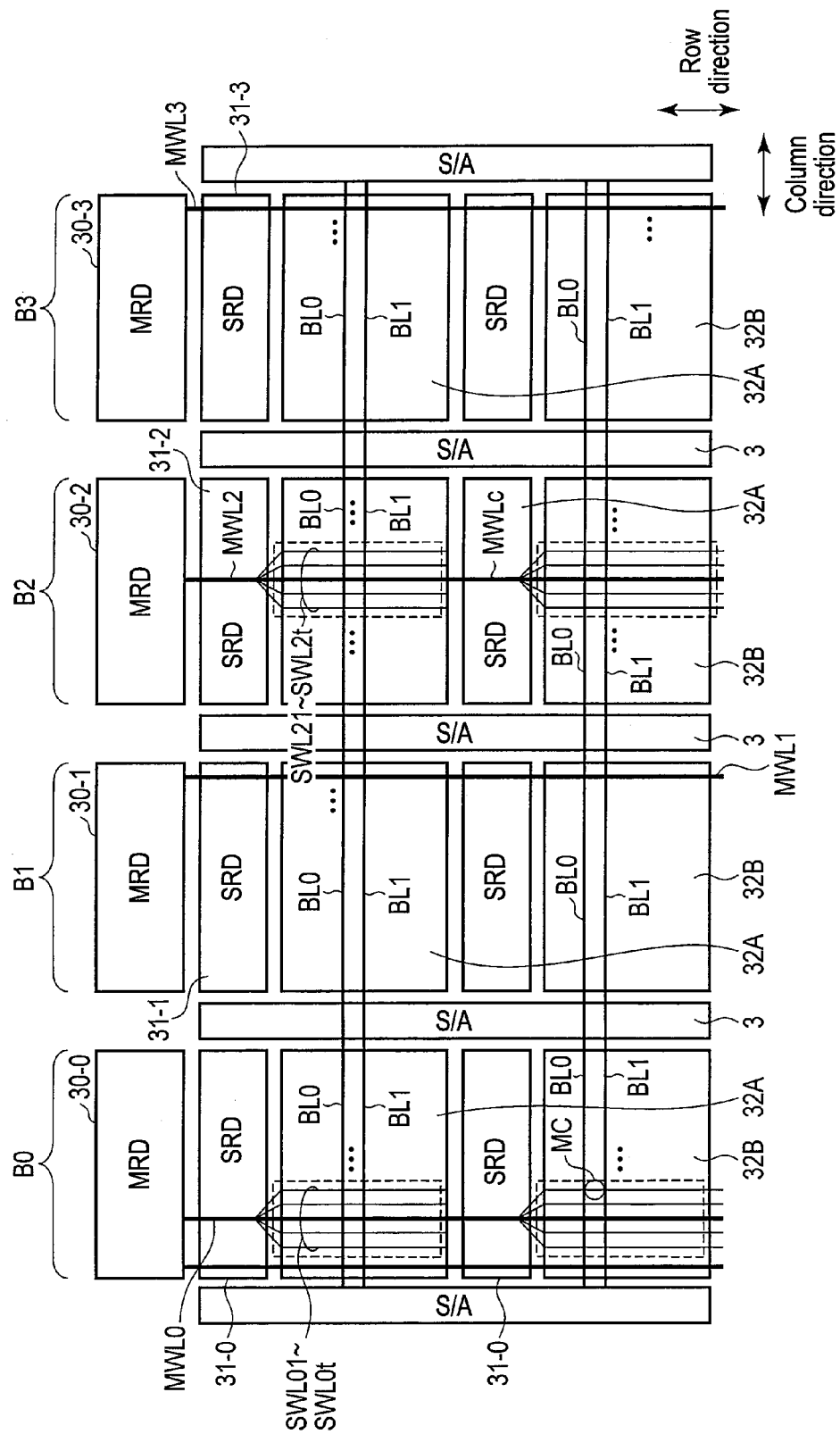
F I G. 18

| Timing of activation of MWL and SWL | t1 | t2 | t3 | t4 |
|---|---|---|---|---|
| Example A | [R_A]-Latch | [R_B]-Latch | [R_C]-Latch | [R_D]-Latch Activation of MWL and SWL |
| Example B | [R_A]-Latch | [R_B]-Latch Activation of MWL | [R_C]-Latch | [R_D]-Latch Activation of SWL |
| Example C | [R_A]-Latch | [R_B]-Latch Activation of MWL and SWL | [R_C]-Latch | [R_D]-Latch |

F I G. 20

Timing of activation of MWL and SWL

|  | t2 | t3 | t4 |
|---|---|---|---|
| Example A | [R_A]-Latch | [R_B]-Latch | [R_C]-Latch<br>Activation of MWL and SWL |
| Example B | [R_A]-Latch<br>Activation of MWL | [R_B]-Latch | [R_C]-Latch<br>Activation of SWL |
| Example C | [R_A]-Latch<br>Activation of MWL and SWL | [R_B]-Latch | [R_C]-Latch |

FIG. 21

NONVOLATILE RANDOM ACCESS MEMORY INCLUDING CONTROL CIRCUIT CONFIGURED TO RECEIVE COMMANDS AT HIGH AND LOW EDGES OF ONE CLOCK CYCLE

CROSS-REFERENCE TO RELATED APPLICATIONS

This application is a Divisional application of parent application Ser. No. 14/020,534, filed on Sep. 6, 2013, which claims the benefit of U.S. Provisional Application No. 61/803,997, filed Mar. 21, 2013, the entire contents of which are incorporated herein by reference.

FIELD

Embodiments described herein relate generally to a nonvolatile random access memory.

BACKGROUND

Nonvolatile random access memories such as a magnetic random access memory have been researched and developed as memories for replacing volatile memories such as a DRAM and SRAM.

To reduce the development cost and perform smooth replacement, it is desirable to operate the nonvolatile random access memories by using the same specifications as those of the DRAM and SRAM. It is also possible to achieve low power consumption and normally-off computing by using the nonvolatile random access memories by, e.g., increasing the number of banks forming a memory cell array and minimizing the number of banks to be activated among these banks.

If the number of banks forming the memory cell array increases, however, the number of bits of an address for selecting each of these banks also increases. To achieve the same specifications as those of a versatile DRAM and SRAM as described above, it is necessary to construct a system in which the number of pins does not increase and the operating speed does not decrease even when the number of bits of an address increases.

BRIEF DESCRIPTION OF THE DRAWINGS

FIG. 6 is a timing chart showing the second embodiment;
FIGS. 7, 8, 9, 10, 11, and 12 are views showing examples of the loading of commands and addresses of the second embodiment;
FIG. 14 is a timing chart showing the fourth embodiment;
FIGS. 15, 16, and 17 are views showing examples of the loading of commands and addresses of the fourth embodiment;
FIGS. 18 and 19 are views showing a hierarchical wordline structure;
FIG. 20 is a view showing a variation of the activation timings of main/sub word lines of the second embodiment;
and
FIG. 21 is a view showing a variation of the activation timings of main/sub word lines of the fourth embodiment.

DETAILED DESCRIPTION

In general, according to one embodiment, a nonvolatile random access memory comprises: a memory cell array with banks, each bank including rows; a first word lines provided in corresponding to the rows; an address latch circuit which latches a first row address signal; a row decoder which activates one of the first word lines; and a control circuit which is configured to: execute a first operation which activates one of the banks based on a bank address signal when a first command is loaded, and a second operation which latches the first row address signal in the address latch circuit, and execute a third operation which activates one of the first word lines by the row decoder based on a second row address signal and the first row address signal latched in the address latch circuit when a second command is loaded after the first command.

[Nonvolatile Random Access Memory]

Figure 1:
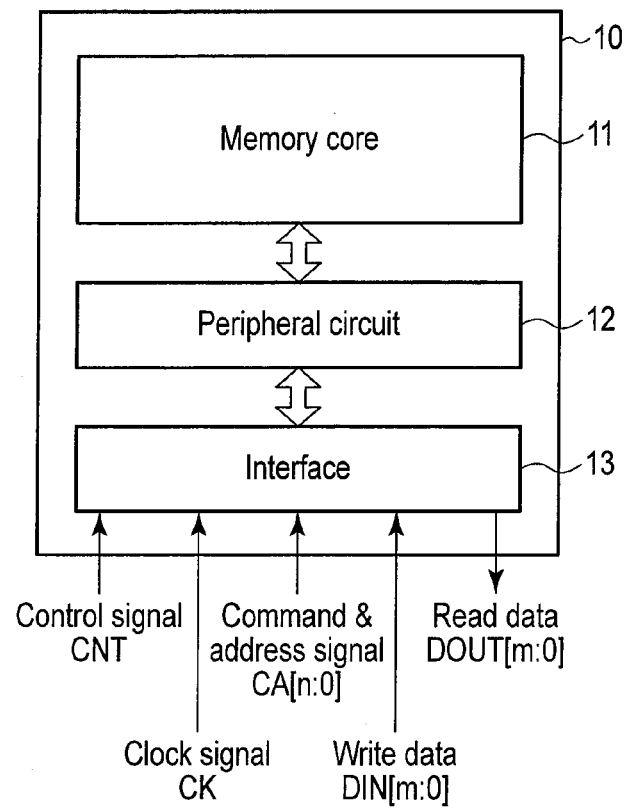
FIG. 1 is a view showing a nonvolatile random access memory.

FIG. 1 shows a nonvolatile random access memory.

A nonvolatile random access memory 10 includes a memory core 11, peripheral circuit 12, and interface 13.

The memory core 11 includes a plurality of magnetoresistive elements (memory cells) for storing data. The peripheral circuit 12 executes data read/write for the memory core 11.

The interface 13 receives control signals CNT for read/write, a clock signal CK for controlling the operation timings of read/write, and a command & address signal CA[n:0] for determining an internal operation for read/write and designating an address of the memory cell to be accessed in the memory core 11.

Also, the interface 13 outputs read data DOUT[m:0] and receives write data DIN[m:0].

CA[n:0] means (n+1)-bit command & address signals CA[n], CA[n−1], . . . , CA[0]. DOUT[m:0] means (m+1)-bit read data DOUT[m], DOUT[m−1], . . . , DOUT[0]. DIN[m:0] means (m+1)-bit write data DIN[m], DIN[m−1], . . . , DIN[0].

Note that both of n and m are natural numbers.

Figure 2:
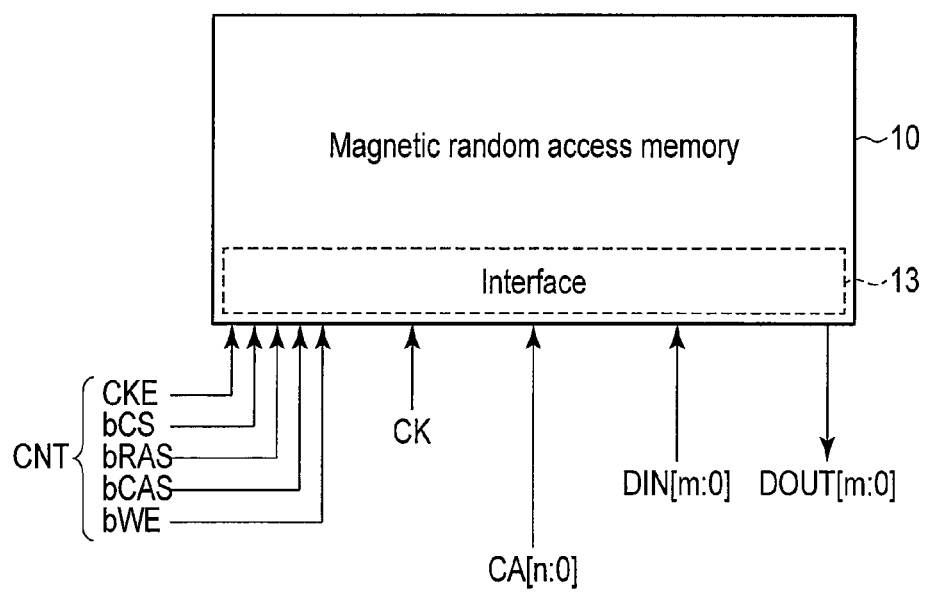
FIG. 2 is a view showing the specifications of an interface.

FIG. 2 shows the specifications of the interface.

The interface 13 of the nonvolatile random access memory 10 has two data path systems in order to, e.g., output the read data DOUT[m:0] and receive the write data DIN[m:0] in parallel, thereby improving the throughput.

It is, however, also possible to use the same data path system as an input path and output path.

According to the control signal CNT and the command & address signal CA[n:0], in the present embodiment, the control signal CNT comprises only a clock enable signal CKE and a chip select signal bCS, and a decoding of the command of read, write and so on, is executed base on a coded command using CA[n:0].

Note that CK is a clock signal for executing the data input/output and the command input described above synchronously.

Figure 3:
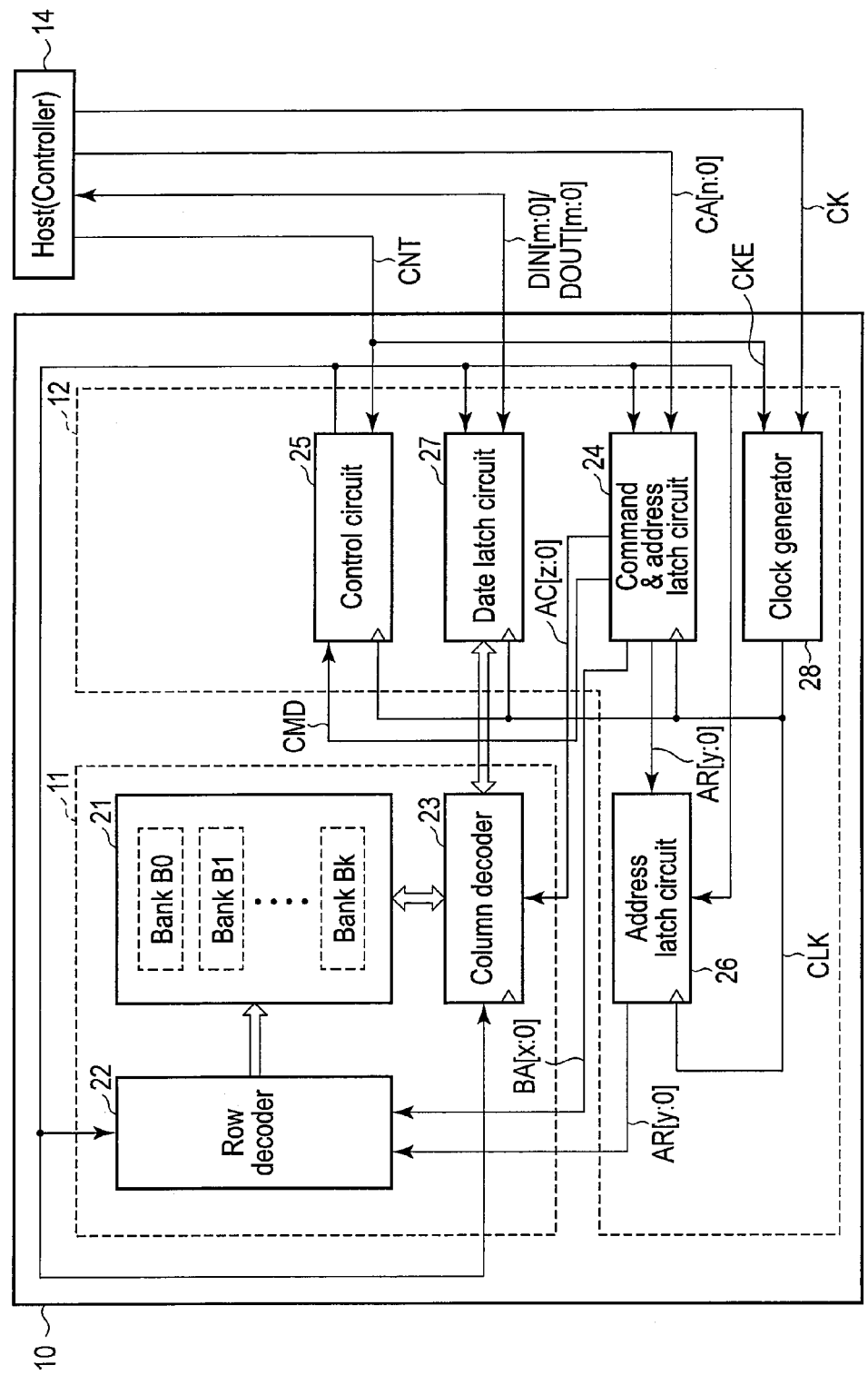
FIG. 3 is a view showing a memory core and peripheral circuit.

FIG. 3 shows the memory core and peripheral circuit.

The memory core 11 includes a memory cell array 21, row decoder 22, and column decoder 23. The memory cell array 21 includes k (k is a natural number of 2 or more) banks B0, B1, . . . , Bk. Since the banks B0, B1, . . . , Bk can independently be activated, the power consumption can be reduced by, e.g., activating only necessary banks during read/write.

The row decoder 22 decodes, e.g., an x-bit bank address signal BA[x:0] for selecting one of the k banks B0, B1, . . . , Bk, and a y-bit row address signal AR[y:0] for selecting one row in the selected bank. The row address signal AR[y:0] may also include, e.g., an upper bit, medium bit, and lower bit.

The column decoder 23 decodes, e.g., a z-bit column address signal AC[z:0] for selecting one column in the memory cell array 21.

The peripheral circuit 12 includes a command & address latch circuit 24, data latch circuit 25, control circuit 26, address latch circuit 27, and clock generator 28.

The command & address latch circuit 24 receives the command & address signal CA[n:0] from a host 14. That is, the command & address latch circuit 24 temporarily holds a command signal CMD for determining an internal operation for read/write, and an address signal ADD for designating an address in the memory core 11.

The command signal CMD is transferred to the control circuit 25. The control circuit 25 controls an internal operation based on the control signals CNT and command signal CMD from the host 14.

Of the address signal ADD, the bank address signal BA[x:0] is transferred to the row decoder 22, the row address signal AR[y:0] is transferred to the address latch circuit 26, and the column address signal AC[z:0] is transferred to the column decoder 23.

In this embodiment as will be described later, when an active command for activating a word line (row) in a selected bank is input, a portion of the row address signal AR[y:0] is input to the address latch circuit 26. Also, when a predetermined command preceding the active command is input, another portion of the row address signal AR[y:0] is input to the address latch circuit 26 in advance.

As described above, a portion of the row address signal AR[y:0] is input in advance before the active command is input. Therefore, even when, for example, the number of bits of the row address signal AR[y:0] for selecting a word line (row) in the memory cell array 21 increases, the nonvolatile random access memory can be incorporated into the system without increasing the number of pins and decreasing the operating speed, i.e., without changing the specifications.

Note that the predetermined command is, e.g., a bank precharge command for precharging a selected bank. When the bank precharge command is input, the row decoder 22 receives the bank address signal BA[x:0], and starts precharging the selected bank.

The active command is a command for performing an active operation of activating one (selected word line) of a plurality of word lines in a selected bank. The bank precharge command is a command for performing a bank precharge operation of setting one (selected bank) of a plurality of banks in an initial state (precharge state) for read/write.

The data latch circuit 27 temporarily holds the read data DOUT[m:0] or write data DIN[m:0]. The read data DOUT [m:0] is read from a memory cell in a selected bank via the column decoder 23. The write data DIN[m:0] is written to a memory cell in a selected bank via the column decoder 23.

The clock generator 28 generates an internal clock signal CLK based on the clock signal CK from the host 14. The internal clock signal CLK is input to the command & address latch circuit 24, control circuit 25, address latch circuit 26, and data latch circuit 27, and controls the operation timings of these circuits.

Figure 4:
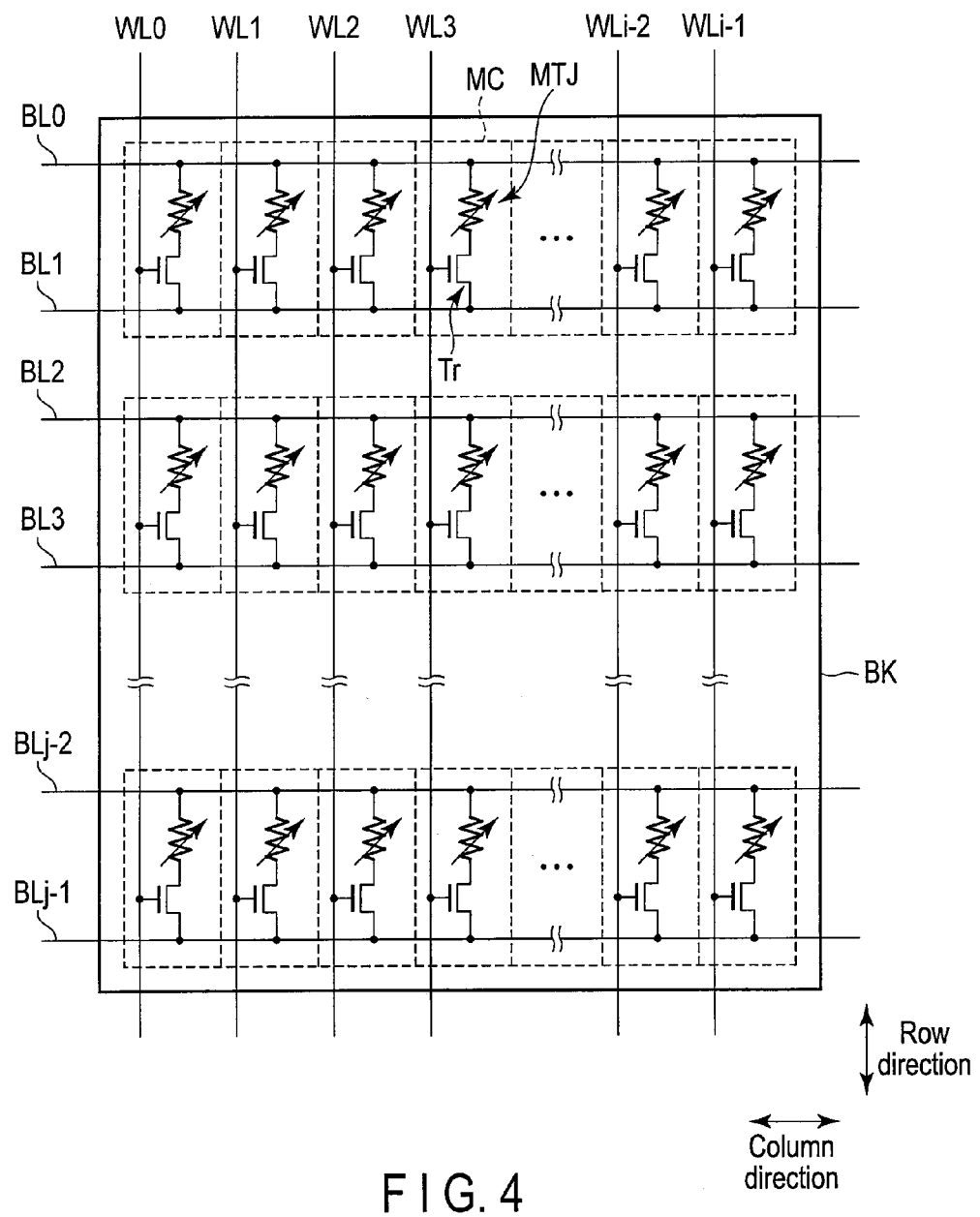
FIG. 4 is a view showing a memory cell array.

FIG. 4 shows an example of the memory cell array.

In this example, the arrangement of one bank Bk in the memory cell array will be explained. Also, a magnetic random access memory is adopted as an example of the nonvolatile random access memory.

A plurality of memory cells MC are arranged in the form of an array along the row and column directions. A plurality of word lines WL1 to WLi-1 are formed in one-to-one correspondence with a plurality of rows, and run in the row direction in the bank Bk. A plurality of bit lines BL1 to BLj-1 run in the column direction in the bank Bk. Note that i is a natural number of 2 or more, and j is an even number of 2 or more.

One memory cell MC includes one magnetoresistive element MTJ and one selection transistor (FET: Field Effect Transistor) Tr connected in series. One memory cell MC includes one control node and two current nodes.

The control node is connected to one word line WLi-1. One of the two current nodes is connected to an even-numbered bit line BLj-2, and the other is connected to an odd-numbered bit line BLj-1.

The magnetoresistive element MTJ includes a first ferromagnetic layer (magnetization pinned layer) in which the magnetization direction is invariable, a second ferromagnetic layer (magnetization free layer) in which the magnetization direction is variable, and an insulating layer (tunnel barrier layer) formed between the first and second ferromagnetic layers.

The magnetoresistive element MTJ is, e.g., a spin-transfer torque element capable of changing the magnetization direction in the second ferromagnetic layer by a spin-transfer torque current. That is, a spin-transfer torque current (bidirectional electric current) flowing between the even-numbered bit line BLj-2 and odd-numbered bit line BLj-1 determines the magnetization direction in the second ferromagnetic layer of the magnetoresistive element MTJ.

Note that the magnetoresistive element MTJ can be either a perpendicular magnetization type element in which the magnetization direction of residual magnetization is perpendicular to the film surface (the interface between the first or second ferromagnetic layer and the insulating layer), or an in-plane magnetization type element in which this magnetization direction is parallel to the film surface.

EMBODIMENTS

Embodiments using the nonvolatile random access memory shown in FIGS. 1, 2, and 3 will be explained below.

That is, the preconditions are that the memory cell array includes a plurality of banks, each bank includes a plurality of rows, and a plurality of word lines are formed in one-to-one correspondence with the plurality of rows.

First & Second Embodiments

Figure 5:
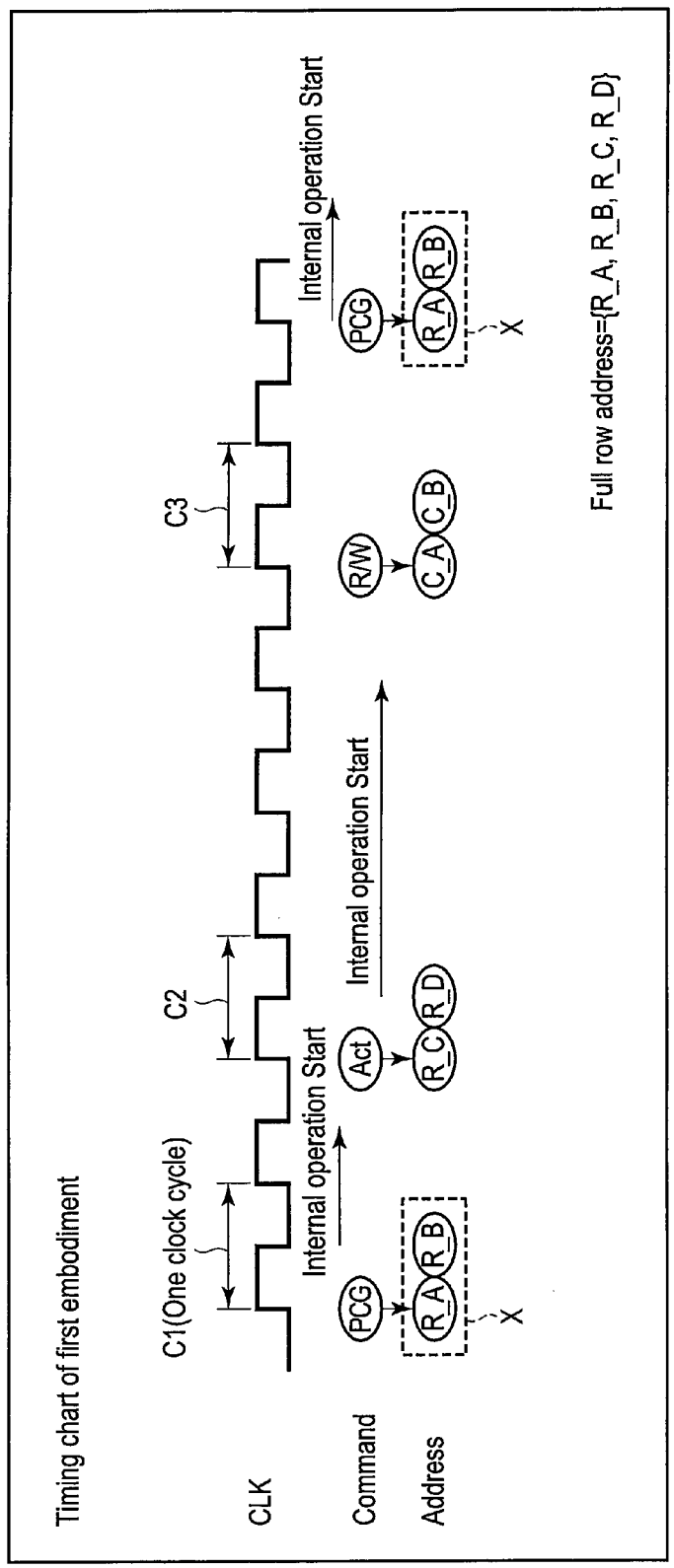
FIG. 5 is a timing chart showing the first embodiment.

FIG. 5 shows a timing chart according to the first embodiment.

The internal clock signal CLK is generated by, e.g., the clock generator 28 shown in FIG. 3. In a first clock cycle (one clock cycle) C1 of the internal clock signal CLK, a bank precharge command (first command) PCG is input (loaded).

When the bank precharge command PCG according to an active bank is input in state of activating the active bank among a plurality of banks, a bank precharge operation (first operation) is performed based on a bank address signal, and also performs a preactive operation (second operation) of latching first row address signals R_A and R_B in the address latch circuit 26 shown in FIG. 3.

That is, the first embodiment has the feature that when the bank precharge command PCG is input, an operation that the first row address signals R_A and R_B are preloaded is added (a region X) as a new preactive operation separated from the bank precharge operation.

The bank precharge operation is executed as an internal operation of the nonvolatile random access memory by using, e.g., two clock cycles, and the preactive operation is executed as an internal operation separated from the internal operation of the bank precharge operation of the nonvolatile random access memory by using, e.g., one clock cycle.

In a second clock cycle (one clock cycle) C2 of the internal clock signal CLK, an active command (second command) Act is input (loaded).

When the active command Act is input, the control circuit 25 shown in FIG. 3 loads second row address signals R_C and R_D, and, based on the second row address signals R_C and R_D, and the first row address signals R_A and R_B latched in the address latch circuit 26 shown in FIG. 3, performs an active operation (third operation) of activating one of the plurality of word lines in the memory cell array 21 by the row decoder 22 shown in FIG. 3.

Note that the address latch circuit 26 shown in FIG. 3 keeps latching the first row address signals R_A and R_B until the active command Act is input.

The active operation is executed as an internal operation of the nonvolatile random access memory by using, e.g., four clock cycles.

Also, a read/write command R/W is input (loaded) in a third clock cycle (one clock cycle) C3 of the internal clock signal CLK.

When the read/write command R/W is input, the control circuit 25 shown in FIG. 3 performs an operation of receiving column address signals C_A and C_B.

In the first embodiment as described above, the input of the row address signals R_A and R_B is available in advance in the time of inputting the row address signals R_A and R_B based on the bank precharge command PCG, separated from the time of inputting the row address signals R_C and R_D based on the active command Act.

Therefore, even when, for example, the number of bits of the full row address signals for selecting a plurality of word lines (a plurality of rows) in the memory cell array 21 shown in FIG. 3 increases, the nonvolatile random access memory can be incorporated into the system without increasing the number of pins and decreasing the operating speed depending on the addition of inputting the address signal based on the active command Act, i.e., without large changing the specifications.

FIG. 6 shows a timing chart according to the second embodiment.

When compared to the first embodiment, the second embodiment has the feature that commands and address signals are loaded based on the high edge (↑) and low edge (↓) of one clock cycle of the internal clock signal CLK.

The internal clock signal CLK is generated by, e.g., the clock generator 28 shown in FIG. 3. At the high edge (time t1) of a first clock cycle (one clock cycle) C1 of the internal clock signal CLK, a bank precharge command (first command) PCG is input (loaded).

Also, a portion R_A of a first row address signal is input (loaded) at the high edge (time t1) of the first clock cycle (one clock cycle) C1, and another portion R_B of the first row address signal is input (loaded) at the low edge (time t2) of the first clock cycle (one clock cycle) C1.

When the bank precharge command PCG is inputted in an active bank in state of activating the active bank among a plurality of banks, a bank precharge operation (first operation) is performed based on a bank address signal, and also performs a preactive operation (second operation) of latching the first row address signals R_A and R_B in the address latch circuit 26 shown in FIG. 3.

That is, the second embodiment also has the feature that when the bank precharge command PCG is input, an operation that the first row address signals R_A and R_B are preloaded (a region X) is added as new preactive operation separated from the bank precharge operation.

The bank precharge operation is executed as an internal operation of the nonvolatile random access memory by using, e.g., two clock cycles, and the preactive operation is executed as an internal operation separated from the internal operation of the bank precharge operation of the nonvolatile random access memory by using, e.g., one clock cycle.

At the high edge (time t3) of a second clock cycle (one clock cycle) C2 of the internal clock signal CLK, an active command (second command) Act is input (loaded).

Also, a portion R_C of a second row address signal is input (loaded) at the high edge (time t3) of the second clock cycle (one clock cycle) C2, and another portion R_D of the second row address signal is input (loaded) at the low edge (time t4) of the second clock cycle (one clock cycle) C2.

When the active command Act is input, the control circuit 25 shown in FIG. 3 performs an active operation (third operation) of activating one of the plurality of word lines in the memory cell array 21 by the row decoder 22 shown in FIG. 3, based on the second row address signals R_C and R_D, and the first row address signals R_A and R_B latched in the address latch circuit 26 shown in FIG. 3.

Note that the address latch circuit 26 shown in FIG. 3 keeps latching the first row address signals R_A and R_B until the active command Act is input.

The active operation is executed as an internal operation of the nonvolatile random access memory by using, e.g., four clock cycles.

Also, a read/write command R/W is input (loaded) at the high edge (time t5) of a third clock cycle (one clock cycle) C3 of the internal clock signal CLK.

In addition, a portion C_A of a column address signal is input (loaded) at the high edge (time t5) of the third clock cycle (one clock cycle) C3, and another portion C_B of the column address signal is input (loaded) at the low edge (time t6) of the third clock cycle (one clock cycle) C3.

When the read/write command R/W is input, the control circuit 25 shown in FIG. 3 performs a read/write operation by selecting one of a plurality of bit line pairs in the memory cell array 21 by the column decoder 23 shown in FIG. 3 based on the column address signals C_A and C_B.

As described above, the input of the row addresses is available in advance in the time of inputting the row address signals R_A and R_B based on the bank precharge command PCG separated from the time of inputting the row address signal R_C and R_D based on the active command.

Therefore, even when, for example, the number of bits of the full row address signals for selecting a plurality of word lines (a plurality of rows) in the memory cell array 21 shown in FIG. 3 increases, the nonvolatile random access memory can be incorporated into the system without increasing the number of pins and decreasing the operating speed depending on the addition of inputting the address signal based on the active command, i.e., without large changing the specifications.

FIGS. 7, 8, 9, 10, 11, and 12 show examples of the loading of commands and addresses in the first and second embodiments.

In these drawings, CLK denotes an internal clock signal generated based on the clock signal CK input from a clock terminal (pin). Also, CA0 to CA9 denote command & address signals input from command & address terminals (pins).

In the examples, the number of command & address terminals CA0 to CA9 is 10. However, the number of terminals is 10 in order to make the explanation clearly understandable, and hence is not limited to this value.

Also, it is assumed in the following explanation that the number of banks in the memory cell array is eight, and the number of bits of bank address signals BA0, BA1, and BA2 for selecting these banks is three. However, these numbers are also so set as to make the explanation readily understandable, and hence are not limited to these values.

Furthermore, in the examples, it is assumed that the full row address signal has 18 bits from R0 to R17, and a first row address signal (a portion of the full row address signal) that is input when the bank precharge command PCG is input has upper bits R14 to R17.

These numbers are also examples, however, and what is important for this embodiment is that a portion of the full row address signal is input in advance when the bank precharge command PCG is input.

FIGS. 7 and 8 are examples in which an assignment of the two kind of bank address is available, and an assignment of a bank as a target of the precharge operation and a bank as a target of the preactive operation is available separately, in the bank precharge command.

In "Case 1a" of FIG. 7, the bank precharge command (H, H, L, H) is loaded into the nonvolatile random access memory from the command & address terminals CA0 to CA3 based on the high edge (↑) of the internal clock signal CLK.

Also, a flag AB for determining whether to perform an all-bank precharge operation is loaded into the nonvolatile random access memory from the command & address terminal CA4 based on the high edge (↑) of the internal clock signal CLK. The all-bank precharge operation is an operation of returning all of the active banks to the banks of the standby state.

In addition, the bank address signals BA0, BA1, and BA2 as targets of the precharge operation are loaded into the nonvolatile random access memory from the command & address terminals CA7 to CA9 based on the high edge (↑) of the internal clock signal CLK.

After that, the first row address signal (the upper bits R14 to R17 of the full row address signal) is loaded into the nonvolatile random access memory from the command & address terminals CA3 to CA6 based on the low edge (↓) of the internal clock signal CLK (the preactive operation).

Also, the bank address signals BA0, BA1, and BA2 as targets of the preactive operation are loaded into the nonvolatile random access memory from the command & address terminals CA7 to CA9 based on the low edge (↓) of the internal clock signal CLK.

Note that in FIG. 7, X means that the terminal is not used to load a command or address signal at the high edge (↑) or low edge (↓) of the internal clock signal CLK.

"Case 1b" in FIG. 8 is a modification of "Case 1a" in FIG. 7.

This example shown in FIG. 8 differs from the example shown in FIG. 7 in that the first row address signal (the upper bits R14 to R17 of the full row address signal) is loaded into the nonvolatile random access memory based on the high edge (↑) and low edge (↓) of the internal clock signal CLK.

That is, in this example, the upper bits R14 and R15 of the full row address signal are loaded into the nonvolatile random access memory from the command & address terminals CA5 and CA6 based on the high edge (↑) of the internal clock signal CLK, and the upper bits R16 and R17 of the full row address signal are loaded into the nonvolatile random access memory from the command & address terminals CA5 and CA6 based on the low edge (↓) of the internal clock signal CLK (the preactive operation).

The rest is the same as the example shown in FIG. 7, so a repetitive explanation will be omitted.

FIGS. 9 and 10 are examples in which an assignment of a bank address is one kind only, and a bank as a target of the precharge operation and a bank as a target of the preactive operation are the same.

"Case 2a" in FIG. 9 differs from "Case 1a" in FIG. 7 in that the bank address signals BA0, BA1, and BA2 are loaded into the nonvolatile random access memory based on only the high edge (↑) of the internal clock signal CLK because the back precharge operation and active operation have the same bank as a target.

That is, in this example, the bank address signals BA0, BA1, and BA2 are loaded into the nonvolatile random access memory from the command & address terminals CA7 to CA9 based on the high edge (↑) of the internal clock signal CLK, and the bank address signal which is inputted based on the low edge (↓) of the internal clock signal CLK does not exist.

The rest is the same as the example shown in FIG. 7, so a repetitive explanation will be omitted.

"Case 2b" in FIG. 10 differs from "Case 1b" in FIG. 8 in that the bank address signals BA0, BA1, and BA2 are loaded into the nonvolatile random access memory based on only the high edge (↑) of the internal clock signal CLK because the back precharge operation and active operation have the same bank as a target.

That is, in this example, the bank address signals BA0, BA1, and BA2 are loaded into the nonvolatile random access memory from the command & address terminals CA7 to CA9 based on the high edge (↑) of the internal clock signal CLK, and are not input based on the low edge (↓) of the internal clock signal CLK.

The rest is the same as the example shown in FIG. 8, so a repetitive explanation will be omitted.

In case of FIGS. 7 to 10, the bank precharge operation and the preactive operation are executed by the bank precharge command only. In contrast, in FIGS. 11 and 12, the preactive command is defined newly, the bank precharge operation is executed based on the bank precharge command only, the preactive operation is executed based on the preactive command only, and the bank precharge command and the preactive command are inputted continuously by a high edge and a low edge in the same clock.

An example for realizing the internal operation as same as "Case 1a" in FIG. 7 and an example for realizing the internal operation as same as "Case 1b" in FIG. 8 will be explained below by inputting continuously the bank precharge command and the preactive command.

FIG. 11 is an example for realizing the internal operation as same as "Case 1a" in FIG. 7.

In this example, "Case 3a-1", "Case 3a-2", or "Case 3a-3" is selectable.

For example, "Case 3a-1" is based on "Case 1a", and the preactive command (L, H) is loaded into the nonvolatile random access memory from the command & address terminals CA0 and CA1 based on the low edge (↓) of the internal clock signal CLK, in addition to the bank precharge command (H, H, L, H).

In "Case 3a-2", only the bank precharge operation in "Case 3a-1" is performed. In this case, the command and address signal are loaded based on only the high edge (↑) of the internal clock signal CLK, and are not loaded at the low edge (↓) of the internal clock signal CLK.

In "Case 3a-3", only the preactive operation in "Case 3a-1" is performed. In this case, the command and address signal are loaded based on only the low edge (↓) of the internal clock signal CLK, and are not loaded at the high edge (↑) of the internal clock signal CLK.

FIG. 12 is an example for realizing the internal operation as same as "Case 1b" in FIG. 8.

In this example, "Case 3b-1", "Case 3b-2", or "Case 3b-3" is selectable.

For example, "Case 3b-1" is based on "Case 1b", and the preactive command (L, H) is loaded into the nonvolatile random access memory from the command & address terminals CA1 and CA1 based on the low edge (↓) of the internal clock signal CLK, in addition to the bank precharge command (H, H, L, H).

In "Case 3b-2", only the bank precharge operation in "Case 3b-1" is performed. In this case, the command and address signal are loaded based on only the high edge (↑) of the internal clock signal CLK, and are not loaded at the low edge (↓) of the internal clock signal CLK.

In "Case 3b-3", only the preactive operation in "Case 3b-1" is performed. In this case, the command and address signal are loaded based on only the low edge (↓) of the internal clock signal CLK, and are not loaded at the high edge (↑) of the internal clock signal CLK.

Third & Fourth Embodiments

Figure 13:
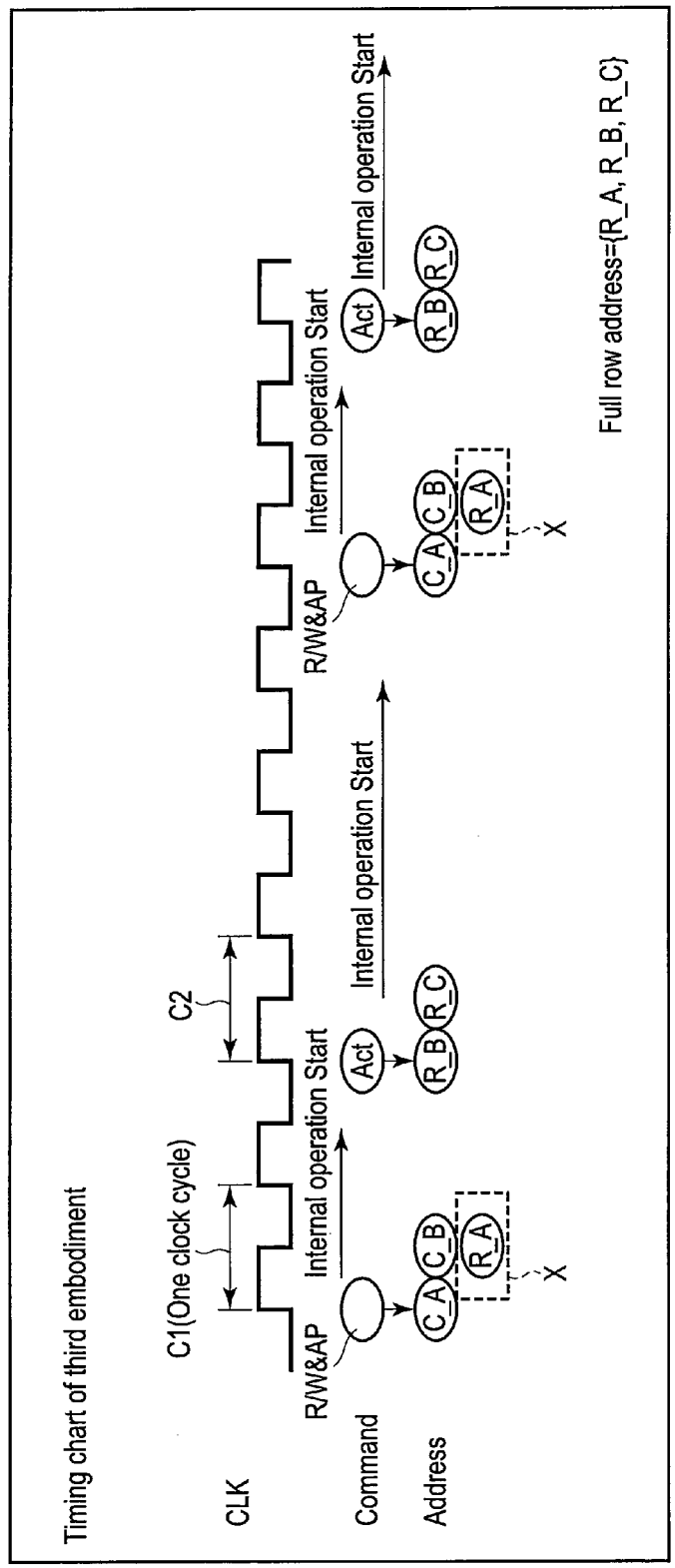
FIG. 13 is a timing chart showing the third embodiment.

FIG. 13 shows a timing chart according to the third embodiment.

The internal clock signal CLK is generated by, e.g., the clock generator 28 shown in FIG. 3. A read/write with auto-precharge command (first command) R/W&AP is input (loaded) in a first clock cycle (one clock cycle) C1 of the internal clock signal CLK.

When the read/write with auto-precharge command R/W&AP is input to the active bank in state of activating the active bank among a plurality of banks, the bank precharge operation (first operation) is performed based on the bank address signal, and also performs a preactive operation (second operation) of latching a first row address signal R_A in the address latch circuit 26 shown in FIG. 3.

That is, the third embodiment has the feature that when the read/write with auto-precharge command R/W&AP is input, the operation that the first row address signal R_A is preloaded (a region X) as new preactive operation separated from the bank precharge operation.

Also, the control circuit 25 shown in FIG. 3 performs an operation of receiving column address signals C_A and C_B when the read/write with auto-precharge command R/W&AP is input.

The bank precharge operation is performed as an internal operation of the nonvolatile random access memory by using, e.g., two clock cycles, and the preactive operation is performed as an internal operation separated from the internal operation of the bank precharge operation of the nonvolatile random access memory by using, e.g., one clock cycle.

In addition, an active command (second command) Act is input (loaded) in a second clock cycle (one clock cycle) C2 of the internal clock signal CLK.

When the active command Act is input, the control circuit 25 shown in FIG. 3 loads second row address signals R_B and R_C, and, based on the second row address signals R_B and R_C, and the first row address signal R_A latched in the address latch circuit 26 shown in FIG. 3, performs an active operation (third operation) of activating one of the plurality of word lines in the memory cell array 21 by the row decoder 22 shown in FIG. 3.

Note that the address latch circuit 26 shown in FIG. 3 keeps latching the first row address signal R_A until the active command Act is input.

The active operation is executed as an internal operation of the nonvolatile random access memory by using, e.g., four clock cycles.

In the third embodiment as described above, the input of the row address signal R_A is available in advance in time of inputting the row address signal R_A based on the bank precharge command separated from the time of inputting the row address signal R_B and R_C based on the active command.

Therefore, even when, for example, the number of bits of the full row address signals R_A, R_B, and R_C for selecting a plurality of word lines (a plurality of rows) in the memory cell array 21 shown in FIG. 3 increases, the nonvolatile random access memory can be incorporated into the system without increasing the number of pins and decreasing the operating speed depending the addition of inputting the address signal, i.e., without large changing the specifications.

FIG. 14 shows a timing chart according to the fourth embodiment.

When compared to the third embodiment, the fourth embodiment has the feature that commands and address signals are loaded based on the high edge (↑) and low edge (↓) of one clock cycle of the internal clock signal CLK.

The internal clock signal CLK is generated by, e.g., the clock generator 28 shown in FIG. 3. A read/write with auto-precharge command (first command) R/W&AP is input (loaded) at the high edge (time t1) of a first clock cycle (one clock cycle) C1 of the internal clock signal CLK.

Also, a portion C_A of a column address signal is input (loaded) at the high edge (time t1) of the first clock cycle (one clock cycle) C1, and another portion C_B of the column address signal is input (loaded) at the low edge (time t2) of the first clock cycle (one clock cycle) C1.

In addition, a first row address signal R_A is input (loaded) at the low edge (time t2) of the first clock cycle (one clock cycle) C1.

When the read/write with auto-precharge command R/W&AP is input to an active bank in state of activating the active bank among a plurality of banks, the bank precharge operation (first operation) is performed based on the bank address signal, and also performs a preactive operation (second operation) of latching the first row address signal R_A in the address latch circuit 26 shown in FIG. 3.

That is, the fourth embodiment also has the feature that when the read/write with auto-precharge command R/W&AP is input, an operation that the first row address signal R_A is preloaded (a region X) as new preactive operation is added separated from the bank precharge operation.

The bank precharge operation is executed as an internal operation of the nonvolatile random access memory by using, e.g., two clock cycles, and the preactive operation is executed as an internal operation separated from the internal operation of the bank precharge operation of the nonvolatile random access memory by using, e.g., one clock cycle.

An active command (second command) Act is input (loaded) at the high edge (time t3) of a second clock cycle (one clock cycle) C2 of the internal clock signal CLK.

Also, a portion R_B of a second row address signal is input (loaded) at the high edge (time t3) of the second clock cycle (one clock cycle) C2, and another portion R_C of the second row address signal is input (loaded) at the low edge (time t4) of the second clock cycle (one clock cycle) C2.

When the active command Act is input, the control circuit 25 shown in FIG. 3 performs an active operation (third operation) of activating one of the plurality of word lines in the memory cell array 21 by the row decoder 22 shown in FIG. 3, based on the second row address signals R_B and R_C, and the first row address signal R_A latched in the address latch circuit 26 shown in FIG. 3.

Note that the address latch circuit 26 shown in FIG. 3 keeps latching the first row address signal R_A until the active command Act is input.

The active operation is executed as an internal operation of the nonvolatile random access memory by using, e.g., four clock cycles.

As described above, the input of the row address signal is available in advance in time of inputting the row address signal R_A based on the bank precharge command PCG separated from the time of inputting the row address signal R_B and R_C based on the active command Act.

Therefore, even when, for example, the number of bits of the full row address signals R_A, R_B, and R_C for selecting a plurality of word lines (a plurality of rows) in the memory cell array 21 shown in FIG. 3 increases, the nonvolatile random access memory can be incorporated into the system without increasing the number of pins and decreasing the operating speed depending on the addition of inputting the address signal based on the active command Act, i.e., without large changing the specifications.

FIGS. 15, 16, and 17 show examples of the loading of commands and addresses in the third and fourth embodiments.

In these drawings, CLK denotes an internal clock signal generated based on the clock signal CK input from a clock terminal (pin). Also, CA0 to CA9 denote command & address signals input from command & address terminals (pins).

In the examples, the number of command & address terminals CA0 to CA9 is 10. However, the number of terminals is 10 in order to make the explanation clearly understandable, and hence is not limited to this value.

Also, it is assumed in the following explanation that the number of banks in the memory cell array is eight, and the number of bits of bank address signals BA0, BA1, and BA2 for selecting these banks is three. However, these numbers are also so set as to make the explanation readily understandable, and hence are not limited to these values.

Furthermore, in the examples, it is assumed that the full row address signal have 18 bits from R0 to R17, and a first row address signal (a portion of the full row address signal) that is input when the read/write with auto-precharge command R/W&AP is input have upper bits R14 to R17.

These numbers are also examples, however, and what is important for this embodiment is that a portion of the full row address signal is input in advance when the bank precharge command PCG is input.

"Case 4" in FIG. 15 is an example that an allocation of a bank address is one kind only, and a bank as a target of the precharge and a bank as a target of the preactive operation are the same.

As shown in FIG. 15, the read/write with auto-precharge command is loaded into the nonvolatile random access memory from the command & address terminals CA0 to CA2 (H, L, H/L) based on the high edge (↑) of the internal clock signal CLK, and is also loaded into the nonvolatile random access memory from the command & address terminal CA0 (H(AP)) based on the low edge (↓) of the internal clock signal CLK.

Also, column address signals C1 and C2 are loaded into the nonvolatile random access memory from the command & address terminals CA5 and CA6 based on the high edge (↑) of the internal clock signal CLK, and column address signals C3 to C7 are loaded into the nonvolatile random access memory from the command & address terminals CA1 to CA5 based on the low edge (↓) of the internal clock signal CLK.

In this example, the full column address signal has seven bits from C1 to C7.

In addition, the bank address signals BA0, BA1, and BA2 as targets of the read/write with auto-precharge operation are loaded into the nonvolatile random access memory from the command & address terminals CA7 to CA9 based on the high edge (↑) of the internal clock signal CLK.

Also, the first row address signal (the upper bits R14 to R17 of the full row address signal) is loaded into the nonvolatile random access memory from the command & address terminals CA6 to CA9 based on the low edge (↓) of the internal clock signal CLK (the preactive operation).

Note that in FIG. 15, X means that the terminal is not used to load a command or address signal at the high edge (↑) or low edge (↓) of the internal clock signal CLK.

FIGS. 16 and 17 are examples that two kind of allocation of the bank address is available, a bank as a target of the precharge operation and a bank as a target of the preactive operation are allocated separately in the read/write with auto-precharge command.

In "Case 5a" of FIG. 16, the read/write with auto-precharge command is loaded into the nonvolatile random access memory from the command & address terminals CA0 to CA2 (H, L, H/L) based on the high edge (↑) of the internal clock signal CLK, and is also loaded into the nonvolatile random access memory from the command & address terminal CA0 (H(AP)) based on the low edge (↓) of the internal clock signal CLK.

Also, the column address signals C1 and C2 are loaded into the nonvolatile random access memory from the command & address terminals CA5 and CA6 based on the high edge (↑) of the internal clock signal CLK, and the column address signals C3 and C4 are loaded into the nonvolatile random access memory from the command & address terminals CA1 and CA2 based on the low edge (↓) of the internal clock signal CLK.

In this example, the full column address signal has four bits from C1 to C4.

In addition, the bank address signals BA0, BA1, and BA2 as targets of read/write are loaded into the nonvolatile random access memory from the command & address terminals CA7 to CA9 based on the high edge (↑) of the internal clock signal CLK.

Also, the bank address signals BA0, BA1, and BA2 as targets of the auto-precharge operation and preactive operation are loaded into the nonvolatile random access memory from the command & address terminals CA7 to CA9 based on the low edge (↓) of the internal clock signal CLK.

Furthermore, the first row address signal (the upper bits R14 to R17 of the full row address signal) is loaded into the nonvolatile random access memory from the command & address terminals CA3 to CA6 based on the low edge (↓) of the internal clock signal CLK (the preactive operation).

Note that in FIG. 16, X means that the terminal is not used to load a command or address signal at the high edge (↑) or low edge (↓) of the internal clock signal CLK.

In "Case 5b" of FIG. 17, the read/write with auto-precharge command is loaded into the nonvolatile random access memory from the command & address terminals CA0 to CA2 (H, L, H/L) based on the high edge (↑) of the internal clock signal CLK, and is also loaded into the nonvolatile random access memory from the command & address terminal CA0 (H(AP)) based on the low edge (↓) of the internal clock signal CLK.

Also, the column address signals C1 to C4 are loaded into the nonvolatile random access memory from the command & address terminals CA3 to CA6 based on the high edge (↓) of the internal clock signal CLK.

In this example, the full column address signal has four bits from C1 to C4.

In addition, the bank address signals BA0, BA1, and BA2 as targets of read/write are loaded into the nonvolatile random access memory from the command & address terminals CA7 to CA9 based on the high edge (↑) of the internal clock signal CLK.

Also, the bank address signals BA1, BA1, and BA2 as targets of the auto-precharge operation and preactive operation are loaded into the nonvolatile random access memory from the command & address terminals CA7 to CA9 based on the low edge (↓) of the internal clock signal CLK.

Furthermore, the first row address signal (the upper bits R14 to R17 of the full row address signal) is loaded into the nonvolatile random access memory from the command & address terminals CA3 to CA6 based on the low edge (↓) of the internal clock signal CLK (the preactive operation).

Note that in FIG. 17, X means that the terminal is not used to load a command or address signal at the high edge (↑) or low edge (↓) of the internal clock signal CLK.

A characteristics of the "Case 5b" is that all of the address signal for read/write are inputted base on the high edge (↑) of the internal clock signal CLK. As a result, the command can be performed independent of the low edge (↓) of the internal clock signal CLK different from the "Case 5a".

Application Examples

The first to fourth embodiments become very effective when combined with a hierarchical word line type memory cell array.

This is so because the hierarchical word line system includes, when selecting one word line (one row) of a memory cell array, steps of first selecting one main word line common to a plurality of sub word lines by using an upper address, and then selecting one of the plurality of sub word lines included in the selected main word line by using a medium or lower address.

That is, the operating speed of the nonvolatile random access memory can be increased by combining the first and second embodiments with the hierarchical word line type memory cell array.

FIG. 18 shows the hierarchical word line type memory cell array.

In this example, the memory cell array includes a plurality of banks B0 to B3. Each of the plurality of banks B0 to B3 includes main row decoders 30-0 to 30-3, sub row decoders 31-0 to 31-3, sub arrays 32A and 32B, and sense amplifiers S/A.

Note that the number of banks B0 to B3 is not limited to four and need only be two or more. Note also that the number of sub arrays 32A and 32B in one bank Br (r is one of 0 to 3) is not limited to two and can also be three or more.

Main word lines MWL0 to MWL3 run in the row direction from the main row decoders 30-0 to 30-3. A plurality of sub word lines SWLr0 to SWLrt (t is a natural number) run in the row direction from the sub row decoders 31-0 to 31-3.

One main word line MWLr is common to the plurality of sub word lines SWLr0 to SWLrt. For example, the main word line MWL0 is common to a plurality of sub word lines SWL01 to SWL0t.

The sense amplifiers S/A are arranged at the two ends of the sub arrays 32A and 32B in the column direction. A pair of bit lines BL0 and BL1 run in the column direction from the sub arrays 32A and 32B.

Figure 19:
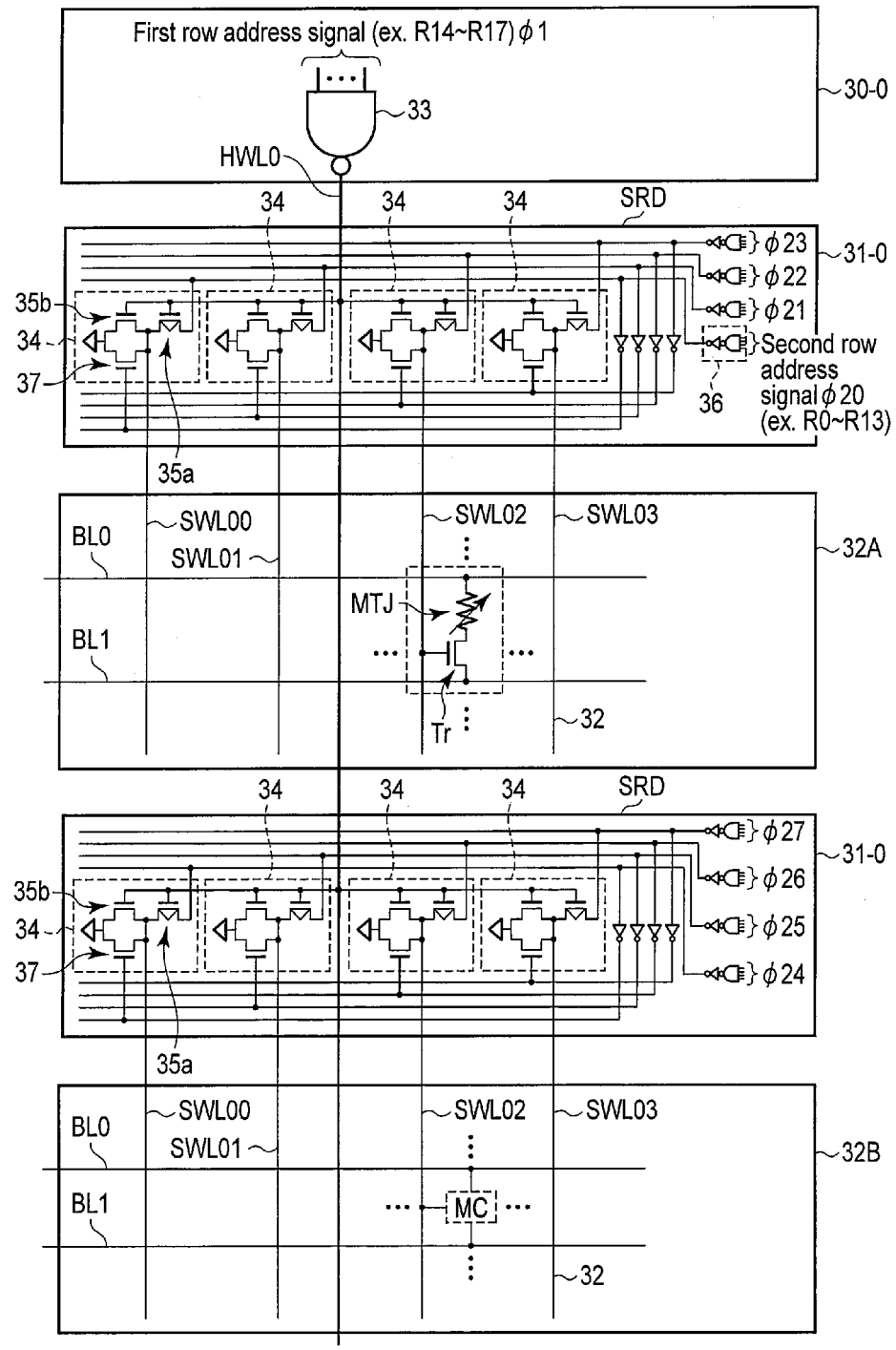

FIG. 19 shows the main row decoder and sub row decoder shown in FIG. 18.

Since the main and sub row decoders in the plurality of banks have the same arrangement, the main row decoder 30-0 and sub row decoder 31-0 shown in FIG. 18 will be explained below. In addition, to make the following explanation clearly understandable, it is assumed that the number of sub word lines SWL01 to SWL03 common to the main word line MWL0 is four.

The main row decoder 30-0 controls the activation of the main word line MWL0 based on the upper bit of a row address signal.

For example, when the memory cell array is combined with the first to fourth embodiments described above, a NAND circuit 33 as the main row decoder 30-0 receives a first row address signal (e.g., R14 to R17) φ1 that is preloaded when the bank precharge command PCG or read/write with auto-precharge command R/W&AP is input.

In this example, the main word line MWL0 is activated when all bits of the first row address signal φ1 are "H". That is, the main word line MWL0 changes to "L".

As will be described later, the activation timing of the main word line MWL0 can be the timing at which the bank precharge command PCG or read/write with auto-precharge command R/W&AP is loaded, or the timing at which the active command Act is loaded after that.

When the main word line MWL is "L" (activated), a p-channel FET (Field Effect Transistor) 35a is ON and an n-channel FET 35b is OFF in a driver unit 34. That is, the sub row decoder 31-0 is also activated at this point of time.

The sub row decoder 31-0 controls the activation of the sub word lines SWL00 to SWL03 in the sub arrays 32A and 32B based on the medium or lower bit of the row address signal.

For example, when the memory cell array is combined with the above-described first to fourth embodiments, an AND circuit 36 as the sub row decoder 31-0 receives second row address signal set (e.g., R0 to R13) φ20 to φ27 that are loaded when the active command Act is input.

In this example, the sub word line SWL00 in the sub array 32A is activated when all bits of the second row address signal set φ20 are "H".

That is, at this point of time, the output from the AND circuit 36 to which the second row address signal set φ20 is input is "H", and an n-channel FET 37 in the driver unit 34 corresponding to the second row address signal set φ20 is OFF.

Accordingly, the output "H" from the AND circuit 36 to which the second row address signal set 020 is input is transferred to the sub word line SWL00 in the sub array 32A.

At this point of time, at least one of the row address signal among the second row address signal set φ21 to φ27 is "L". That is, since the output from the AND circuit 36 to which these row address signal set φ21 to φ27 are input is all "L", the sub word lines SWL01 to SWL03 in the sub array 32A and all sub word lines SWL00 to SWL03 in the sub array 32B are deactivated.

The activation timing of the sub word line SWL00 is, e.g., the timing at which the active command Act is loaded.

Note that the activation timings of the main word line MWL0 and sub word line SWL00 are different in this example, but they may also be the same.

When the activation timings of the main word line MWL0 and SWL00 are the same, this activation timing can be the timing at which the bank precharge command PCG or read/write with auto-precharge command R/W&AP is loaded, or the timing at which the active command Act is loaded after that.

FIGS. 20 and 21 show the activation timings of the main and sub word lines in the hierarchical word line system shown in FIGS. 18 and 19.

FIG. 20 corresponds to the first and second embodiments described above.

Referring to FIG. 20, t1 to t4 correspond to t1 to t4 shown in FIG. 6, and row address signals R_A, R_B, R_C, and R_D correspond to the row address signals R_A, R_B, R_C, and R_D shown in FIG. 6.

In Example A, R_A is latched at time t1, R_B is latched at time t2, and R_C is latched at time t3. At time t4, R_D is latched, and an operation of activating the main word line MWL0 and sub word line SWL00 shown in FIGS. 18 and 19 is performed based on the row address signals R_A, R_B, R_C, and R_D.

In Example B, R_A is latched at time t1. At time t2, R_B is latched, and an operation of activating the main word line MWL0 shown in FIGS. 18 and 19 is performed based on the row address signals R_A and R_B. At time t3, R_C is latched. At time t4, R_D is latched, and an operation of activating the sub word line SWL00 shown in FIGS. 18 and 19 is performed based on the row address signals R_C and R_D.

Note that it is also possible to activate the main word line MWL0 based on R_A and a part of R_B, and activate the sub word line SWL00 based on a part of R_B, and R_C and R_D.

In Example C, R_A is latched at time t1. At time t2, R_B is latched, and an operation of activating the main word line MWL0 and sub word line SWL00 shown in FIGS. 18 and 19 is performed based on the row address signals R_A and R_B. Also, R_C is latched at time t3, and R_D is latched at time t4. The row address signals R_C and R_D are used not for the purpose of selecting the main word line MWL0 and sub word line SWL00, but for the purpose of, e.g., determining a memory cell to be connected to the sense amplifier S/A.

The examples A, B and C are examples. Thereof, the main word line MWL0 and the sub word line SWL00 can be activated in a timing except the timing described the examples A, B and C.

FIG. 21 corresponds to the third and fourth embodiments described above.

Referring to FIG. 21, t2 to t4 correspond to t2 to t4 shown in FIG. 14, and row address signals R_A, R_B, and R_C correspond to the row address signals R_A, R_B, and R_C shown in FIG. 14.

In Example A, R_A is latched at time t2, R_B is latched at time t3, and R_C is latched at time t4. Also, at time t4, an operation of activating the main word line MWL0 and sub word line SWL00 shown in FIGS. 18 and 19 is performed based on the row address signals R_A, R_B, and R_C.

In Example B, at time t2, R_A is latched, and an operation of activating the main word line MWL0 shown in FIGS. 18 and 19 is performed based on the row address signal R_A. Also, R_B is latched at time t3, and R_C is latched at time t4. In addition, at time t4, an operation of activating the sub word line SWL00 shown in FIGS. 18 and 19 is performed based on the row address signals R_B and R_C.

In Example C, at time t2, R_A is latched, and an operation of activating the main word line MWL0 and sub word line SWL00 shown in FIGS. 18 and 19 is performed based on the row address signal R_A. Also, R_B is latched at time t3, and R_C is latched at time t4. The row address signals R_B and R_C are used not for the purpose of selecting the main word line MWL0 and sub word line SWL00, but for the purpose of, e.g., determining a memory cell to be connected to the sense amplifier S/A.

The examples A, B and C are examples. Thereof, the main word line MWL0 and the sub word line SWL00 can be activated in a timing except the timing described the examples A, B and C.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile random access memory comprising:
   a memory cell array including banks, each bank including rows;
   first word lines formed in one-to-one correspondence with the rows;
   an address latch circuit configured to latch a first row address signal;
   a row decoder configured to activate one of the first word lines;
   a clock generator configured to generate an internal clock signal; and
   a control circuit configured to receive a first command based on a high edge of one clock cycle of the internal clock signal, and receive a second command based on a low edge of the one clock cycle,
   wherein the control circuit:
   performs a first operation of activating one of the banks based on a bank address signal, when the first command is input,
   performs a second operation of latching the first row address signal in the address latch circuit, when the second command is input, and
   performs a third operation of activating one of the first word lines by the row decoder based on a second row address signal and the first row address signal latched in the address latch circuit, when a third command is input after the second command.

2. The memory of claim 1, further comprising a second word line configured to select the rows together,
wherein the row decoder activates the second word line based on the first row address signal, and activates one of the first word lines based on the second row address signal.

3. The memory of claim 2, wherein one of the first word lines and the second word line are activated when the third command is input.

4. The memory of claim 2, wherein:
the second word line is activated when the second command is input, and
one of the first word lines is activated when the third command is input.

5. The memory of claim 1, further comprising a second word line configured to select the rows together,
wherein the row decoder activates the second word line based on the first row address signal and the second row address signal.

6. The memory of claim 1, wherein the address latch circuit keeps latching the first row address signal until the third command is input.

7. The memory of claim 1, wherein a bank as a target of the second operation and a bank as a target of the first operation are selected at the same time.

8. The memory of claim 1, wherein a bank as a target of the second operation is selected independently of a bank as a target of the first operation.

9. The memory of claim 1, wherein the bank address signal is input based on the high edge of the one clock cycle.

10. The memory of claim 1, wherein:
the bank address signal is input based on the high edge of the one clock cycle, and
a bank address signal for designating a bank as a target of the first row address signal is input based on the low edge of the one clock cycle.

11. The memory of claim 1, wherein the first row address signal is input based on at least one of the high edge and low edge of the one clock cycle.

12. The memory of claim 1, wherein the control circuit performs an operation of receiving a column address signal, when a read/write command is input after the third command.

13. The memory of claim 12, wherein:
the first command is a bank precharge command, and the first operation is a bank precharge operation to be executed by the bank precharge command,
the second command is a preactive command, and the second operation is a preactive operation to be executed by the preactive command, and
the third command is an active command, and the third operation is an active operation to be executed by the active command.

14. The memory of claim 1, wherein the control circuit performs an operation of receiving a column address signal when the first command is input.

15. The memory of claim 14, wherein:
the first command is a read/write with auto-precharge command, and the first operation is a bank precharge operation to be executed by the read/write with auto-precharge command,
the second command is a preactive command, and the second operation is a preactive operation to be executed by the preactive command, and
the third command is an active command, and the third operation is an active operation to be executed by the active command.

* * * * *